(12) United States Patent
Edo

(10) Patent No.: US 6,275,423 B1
(45) Date of Patent: Aug. 14, 2001

(54) SEMICONDUCTOR MEMORY DEVICE

(75) Inventor: Sachiko Edo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/549,715

(22) Filed: Apr. 14, 2000

(30) Foreign Application Priority Data

Apr. 15, 1999 (JP) .................................................. 11-108597

(51) Int. Cl.[7] ...................................................... G11C 7/00
(52) U.S. Cl. ................................. 365/189.07; 365/189.04
(58) Field of Search ....................... 361/189.04, 189.07, 361/230.01, 230.03, 168, 233, 238

(56) References Cited

U.S. PATENT DOCUMENTS 6,144,604 * 11/2000 Haller et al. ..................... 365/189.07

* cited by examiner

Primary Examiner—Terrell W. Fears
(74) Attorney, Agent, or Firm—Foley & Lardner

(57) ABSTRACT

A semiconductor memory device is provided for simultaneously reading data of a plurality of bits from its memory cell region and outputting the data successively to an external environment, and includes: an external output section whose output state to the external environment is altered for one output logical level and not altered for another output logical level; a output level generation section for assigning a logical level corresponding to the content of bit-data to a bit freely selected out of the data, and assigning another output logical level to another bit; and a supply section for successively supplying the output logical levels, generated by the output level generation section to correspond with respective bits of the data, to the external output section.

15 Claims, 10 Drawing Sheets

SEMICONDUCTOR MEMORY DEVICE

BACKGROUND OF THE INVENTION

1. Field of the Invention

The present invention relates to a semiconductor memory device for reading data of a number of bits from its memory cell region simultaneously and successively outputting the read data to an external environment.

2. Description of the Related Art

Some semiconductor memory devices, such as dynamic random access memory (DRAM) devices read data of a number of bits simultaneously in one read step and successively output data of the accessed bits in synchronization with the rise and fall phases of the pulse signals of a system reference clock. In such a semiconductor memory device, a given number of parallel bit-data to be accessed are converted into serial data to be output at each rise and fall phase of the system reference clock to be output externally, and the converted serial data are alternately multiplexed to obtain an internal data processing period that is double the data output period of the memory device to produce high speed serial output data to be transmitted to an external system.

FIG. 9 shows a schematic diagram of such a semiconductor memory device. A memory cell array 100 is comprised by a large number of memory cells arranged in an array, where each of the bit-data for rise phases and fall phases of the system reference clock is stored in a predetermined cell location in the array. These stored bit-data contain the data corresponding to the bits for the rise phases and the fall phases, and the burst length, which defines the number of bits that can be exchanged (input/output) in one operation (one write/read step) between the memory cell array 100 and the external environment, is a predetermined quantity. In general, such data are referred to as even data when the data are processed during the rise phase of the clock pulses of the system reference clock, and as odd data when the data are processed during the fall phase of the clock pulses of the system Data-amps 101 are provided to amplify the bit-data of several bits output in one read step. If the number of bits is eight, eight amplifiers will be provided as shown in the diagram so that each bit can be assigned to one amplifier. For a read step, each data-amp is activated by a data-amp-enable signal DAE so that each bit-data output from the memory cell array 100 is amplified to be supplied to the parallel-serial conversion circuit 102e or 102o for even data or odd data, respectively. Parallel 4-bit even data amplified by the four data-amps shown on the right side of FIG. 9 are input into the parallel-serial conversion circuit 102e (DM10, DM12, DM14, DM16 in FIG. 9 refer to those even data), and are output as serial 4-bit even data. On the other hand, parallel 4-bit odd data amplified by the four data-amps shown on the left side of FIG. 9 are input into the parallel-serial conversion circuit 102o (DM11, DM13, DM15, DM17 in FIG. 9 refer to those odd data), and are output as serial 4-bit odd data.

In the memory device having such a structure, for read operation, data are read from the memory cell array 100 and are supplied to the data-amps 101, which are activated so that the read data are amplified to a predetermined signal level. The 4-bit even data DM10, DM12, DM14, DM16 of the read data are supplied to the parallel-serial conversion circuit 102e, and are output successively by being synchronized to the falls of the internal clock of the memory device. On the other hand, the 4-bit odd data DM11, DM13, DM15, DM17 of the read data are supplied to the parallel-serial conversion circuit 102o, and are output successively in synchronization with the rises of the internal clock of the memory device. In this way, because there is no restriction on which phase of the internal clock pulse (rise or fall phase) to use to process even and odd data in the memory device, the data processing timing within the memory device may be inverted with respect to the external data processing timing.

Accordingly, serialized even data and odd data are supplied to a multiplexer (not shown). The multiplexer selects even data and odd data alternately at the rise and fall phases of the system reference clock, and the selected data are output to specific input/output pad successively, thereby outputting high speed serial bit-data containing 1 bit in each data at the rise and fall phases.

In the field of technology of applications of semiconductor memory devices described above, it is sometimes necessary to select and output a certain specific bit (or bits) of the group of bits to be read in one step. For example, in an arrangement of the memory devices M1, M2, M3, . . . MN, . . . to output wired-or output DOR on rise and fall phases of the system reference clock, as shown in FIG. 10, it is sometimes desired to select and output read data of a certain specific bit from one of the memory devices for each 1-bit transfer cycle.

An example of the timing for such an output process is shown in FIG. 11. In this diagram, CLK refers to a reference clock (the system reference clock of the external environment) to operate the system containing the semiconductor memory devices M1, M2, M3, . . . , MN, . . . , each of which selects and outputs one bit of read data at every rise/fall phase independently. An example of the process is such that, at the instant of the first rise of the reference clock CLK after the beginning of the read operation, read data DM10 selected in M1 is output as output DOR, and at the instant of the first fall following the first rise, read data DM31 selected in M3 is output as output DOR, and at the instant of the second rise following the first fall, read data M82 selected in M8 is output as output DOR, and so on, so that any selected read data stored in the memory device can be output at any data transfer cycle to obtain output strings of output DOR shown in FIG. 11. In such a case, it is necessary that the memory devices M1, M2, M3, . . . , MN, . . . are all synchronized to the same external system reference clock and each memory device is accessed in the order of sequence M1, M3, M8, ., M2, . so that the data are output in the sequence M1, M3, M8, ., M2, . as illustrated in the diagram.

However, in the conventional memory devices described above, because the number of bits to be output in one read-step is predetermined, once the read step has been initiated, the read process cannot be stopped until all the serial data of the burst length consisting of the specified number of bits are output. Therefore, the first accessed memory device M1 outputs bit-0 as output DOR but the succeeding bit-1 to bit-7 are also output, and in the second accessed memory device M3, after bit-0 is output bit-1 is output as output DOR, followed by the succeeding bit-2 to bit-7. For the succeeding accessed memory devices, although the specified bits are output as output DOR, other bits included in the burst length are also output. For this reason, output sequence such as the one shown in FIG. 11 cannot be produced by simply connecting conventional semiconductor memory devices.

A conventional approach for resolving such a problem is known as the "chip selection method", in which a specific chip of the memory devices is selected and only the specified bit-data in the selected chip is output. This approach is practical only when the reference clock cycle is slow so that the data, as shown in FIG. 11, are output at relatively low speed.

However, in the chip selection method, only those cells specified by an external addressing device in certain memory devices can output a specified bit-data and other bit-data are floated so that they cannot be output externally. Such a method cannot produce the results shown in FIG. 11 when the operating frequency of the system reference clock is high. That is, because the read addresses are supplied at a high speed of the system reference clock, it becomes difficult to generate a condition to output only a specific bit from a specific memory device and leave the remaining bits in the floating state so as to produce the correct desired output bit sequence.

In some cases, it is necessary to output selective bits in a different manner than that shown in FIG. 11. Such a situation occurs when it is desired to output a certain number of contiguous bits from a memory device, for example, to output bit-3 to bit-7 in memory device M1 containing bit-0 to bit-7. Although bit-3 to bit-7 may be specified, the conventional memory devices are designed to output bit-0 to bit-7 simultaneously so that the unwanted bits bit-0 to bit-2 are also output as the read data, and the desired output of contiguous bits cannot be obtained. The chip selection method also cannot provide the desired results of outputting specific contiguous bits when the system is operating at high frequency.

Accordingly, conventional semiconductor memory devices are not able to produce the output of read data containing only bits selected within a predetermined burst length. Therefore, it is not possible to divide read bit-data contained within the burst length into individual bits every transfer cycle to output any specific bits separately in the desired transfer cycles or to output a specific bit-segment in the burst length contiguously. The chip selection method is also not adaptable, because it cannot process bit-data at the high speed of operation dictated by the system reference clock.

SUMMARY OF THE INVENTION

It is an object of the present invention to provide a semiconductor memory device to enable to select any bit or bits from the group of bit-data read simultaneously in one read step, and output only the selected bit-data at a desired high-speed output cycle to an external environment.

To achieve such an object, the present invention provides a semiconductor memory device for reading data of a plurality of bits from its memory cell region simultaneously and outputting the data to an external environment successively, including:
external output means whose output state to the external environment is altered for one output logical level and not altered for another output logical level;
output level generation means for assigning a logical level corresponding to the content of bit-data to a bit freely selected out of the data, and assigning another output logical level to another bit; and
supply means for successively supplying the output logical levels, generated by the output level generation means to correspond with respective bits of the data, to the external output means.

Therefore, in the present memory device, read data of selected bits for output are assigned the corresponding output logical level by the output level generation means.

However, the read data of another bits, that are not to be output from the memory device, are assigned the another output logical level, that does not change the output state to the external environment, by the output level generation means. And then, to the external output means whose output state is alterable (for data to be output, the output state changes, but for data not to be output, the output state remains unchanged), those output logical levels of the respective bits are supplied successively. Therefore, when the data of another bits (i.e. the bits that are not selected) are being output, the output state to the external environment from the memory device is not altered, so that, in reality, only the selected bit-data are output from the memory device. Accordingly, any desired data can be selected from a group of bits simultaneously read out from the memory cell region, and only data of those selected bits can be output externally from the memory device.

In addition, in the present semiconductor memory device, output logical levels are prepared first so that these levels are supplied successively to the external output means. Therefore, the output logical levels of respective bit-data can be pre-determined internally before converting those bit-data to high-speed serial output data to the external environment. Accordingly, it is possible to obtain sufficient time to pre-determine each output logical level, so that only the selected bit-data can be output to the external environment while being synchronized to external high-speed data processing cycle easily.

DESCRIPTION OF THE PREFERRED EMBODIMENTS

1. Basic Concept

In the following, preferred embodiments will be presented with reference to the drawings. First, the basic technical approach of the present invention exemplified in the following embodiments will be presented.

Some output circuits of semiconductor memory devices may be comprised by an open drain configuration produced by using only an n-channel metal-oxide-semiconductor (NMOS) transistor. Such a memory device is operated in such a way that a high-level signal or no-signal is equivalent as far as the external environment is concerned, so that essentially the memory device acts as though only the low-level signals are output. Therefore, if the memory device operates so that the selected individual bits in the burst length to be output in one read step are exported normally and other bits are forced to the H-level (high level) regardless of the content of the data, it is practically possible that read data are separated into individual bits for transfer in separate cycles and the data in any desired cycle is output independently.

Figure 1:
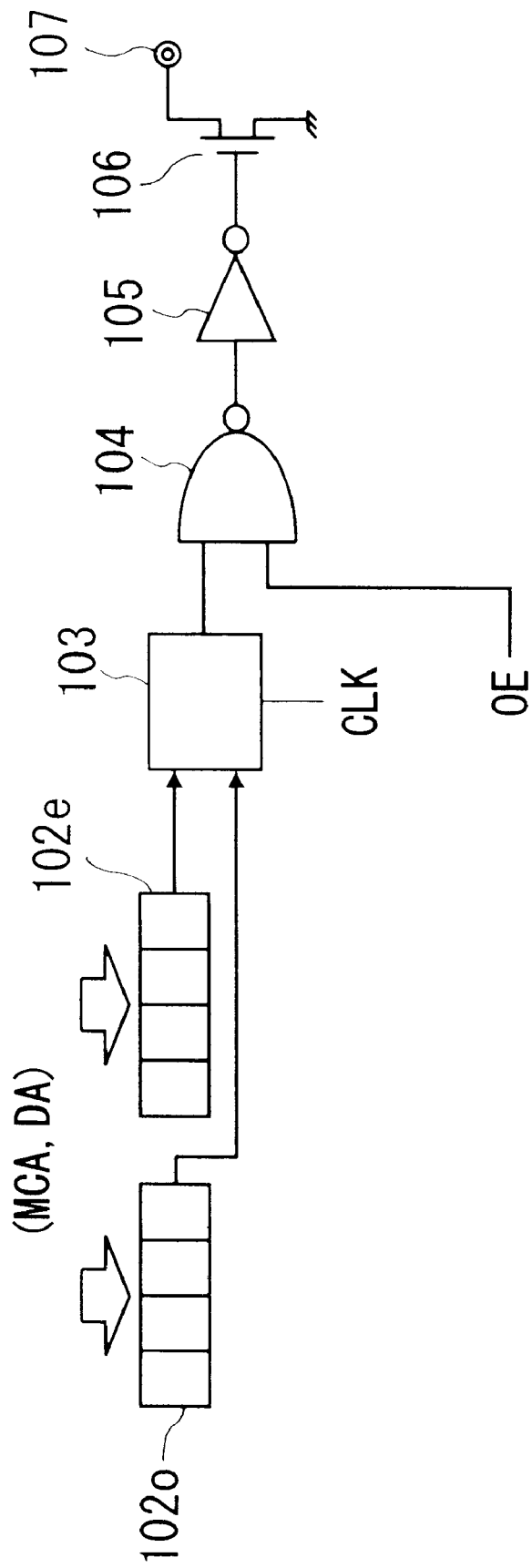
FIG. 1 is a schematic circuit diagram of an example of the structure for controlling an output of a semiconductor memory device including an output circuit comprised by an open drain of a NMOS transistor.
Figure 9:
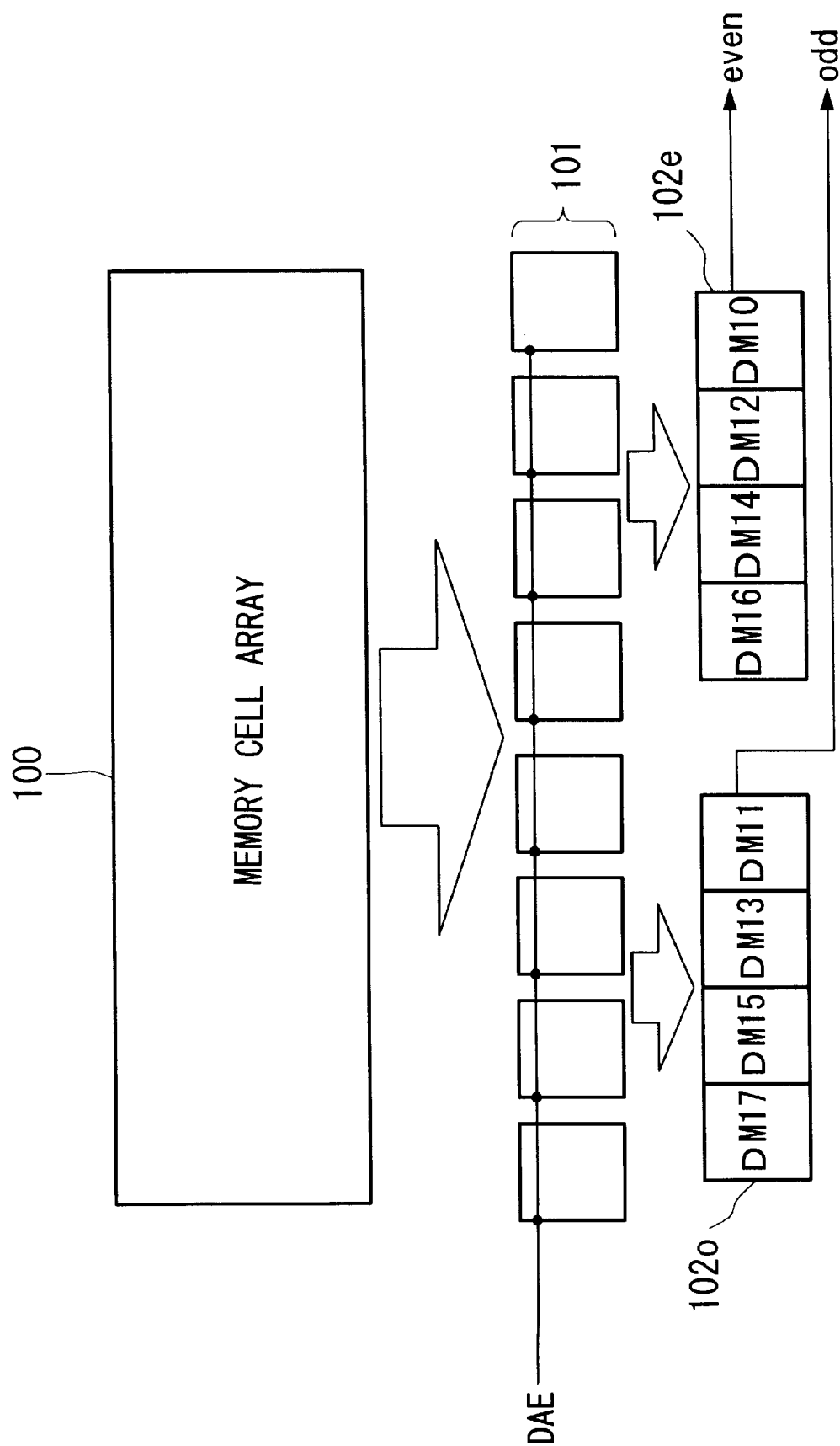
FIG. 9 is a schematic diagram of the conventional semiconductor memory device.
Figure 10:
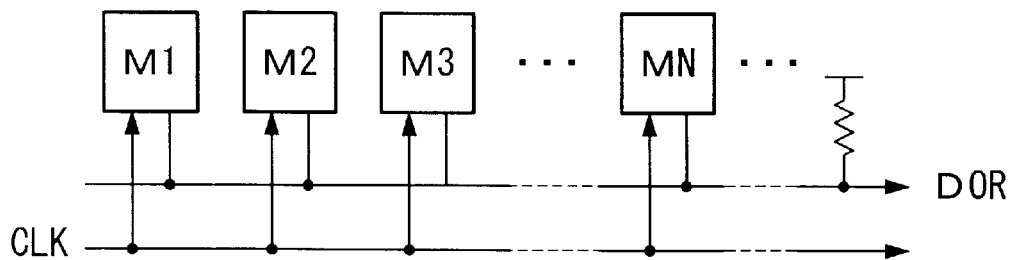
FIG. 10 is a schematic diagram of an arrangement of wired memory devices to obtain wired-or output DOR.

Based on such reasoning, FIG. 1 shows a circuit structure for controlling the data output from a memory device shown in FIG. 9 that has an open-drain output circuit consisting only of an NMOS transistor. In this diagram, the memory cell array 100 and the data-amp 101 are omitted.

A multiplexer 103 is provided in the memory device for receiving read data (even data and odd data) from the parallel-serial conversion circuits 102e, 102o, and alternately selects and outputs data on rise and fall phases of the system reference clock CLK. The NAND circuit 104 receives output data from the multiplexer 103 and the output control signal OE on its input-side, and operates as a NOT-AND circuit, whose output-side is connected to the gate electrode of the NMOS transistor 106 through an inverter 105. Therefore, when the output control signal OE is at the H-level, the gate electrode is applied H-level potential if the read data output from the data-amp is at the H-level, but if the read data is at the L-level (low level), the gate electrode is applied L-level potential.

The NMOS transistor 106 is the output transistor whose drain electrode is connected to the output pad 107 serving as the contact terminal to the external environment, and the source electrode is connected to the reference electrode at the ground potential. An open drain output circuit is composed of this NMOS transistor 106 as illustrated in FIG. 1. In such a output circuit, the voltage impressed on the gate electrode is H-level (export logical level) only when both the read data and the output control signal OE are H-level, resulting in an L-level signal at the output pad 107.

On the other hand, when no read data are being output, the voltage applied to the gate electrode is L-level (ground potential) so that the output pad 107 is at the H-level signal. When this H-level signal is being output, the state between the drain electrode and the source electrode of the NMOS transistor 106 is a non-conductive, high-impedance state, so the voltage of the activated external contact line is held at the output pad 107. The high-impedance state of output from the memory device is termed "Hi-Z" state in the following discussion. If, at least one of either the read data or the output control signal OF is at the L-level, external output is similarly Hi-Z, because the voltage impressed on the gate electrode is L-level, therefore such an operating state of the memory device is equivalent to a state of having no export read data.

Therefore, the output control signal OE should be at the H-level only when the bit-data selected to be output externally in one read step are being output from the multiplexer 103, and, at all other times, it should be at the L-level. If such a control method can be practiced, only the selected bits will be output externally, and other bits will not be output because the output is in the Hi-Z state which is equivalent to the state outputting no data.

However, the multiplexer 103 is designed to output high speed serial data one bit at a time with the rise and fall phases of the system reference clock CLK. For example, the output cycle of the serial data is about 143 MHz for DRAM while that for SRAM is as high as 250 MHz. In other words, data that have been processed through the multiplexer 103 are to be supplied successively at high speed cycles so as to be compatible with the external environment, and therefore, the data are not supplied at the internal processing period of the memory device (double period of the data output period). Therefore, it is difficult to intercept such high speed serial data with the output control signal OE and to switch output bit-data according to such control signals.

Figure 11:
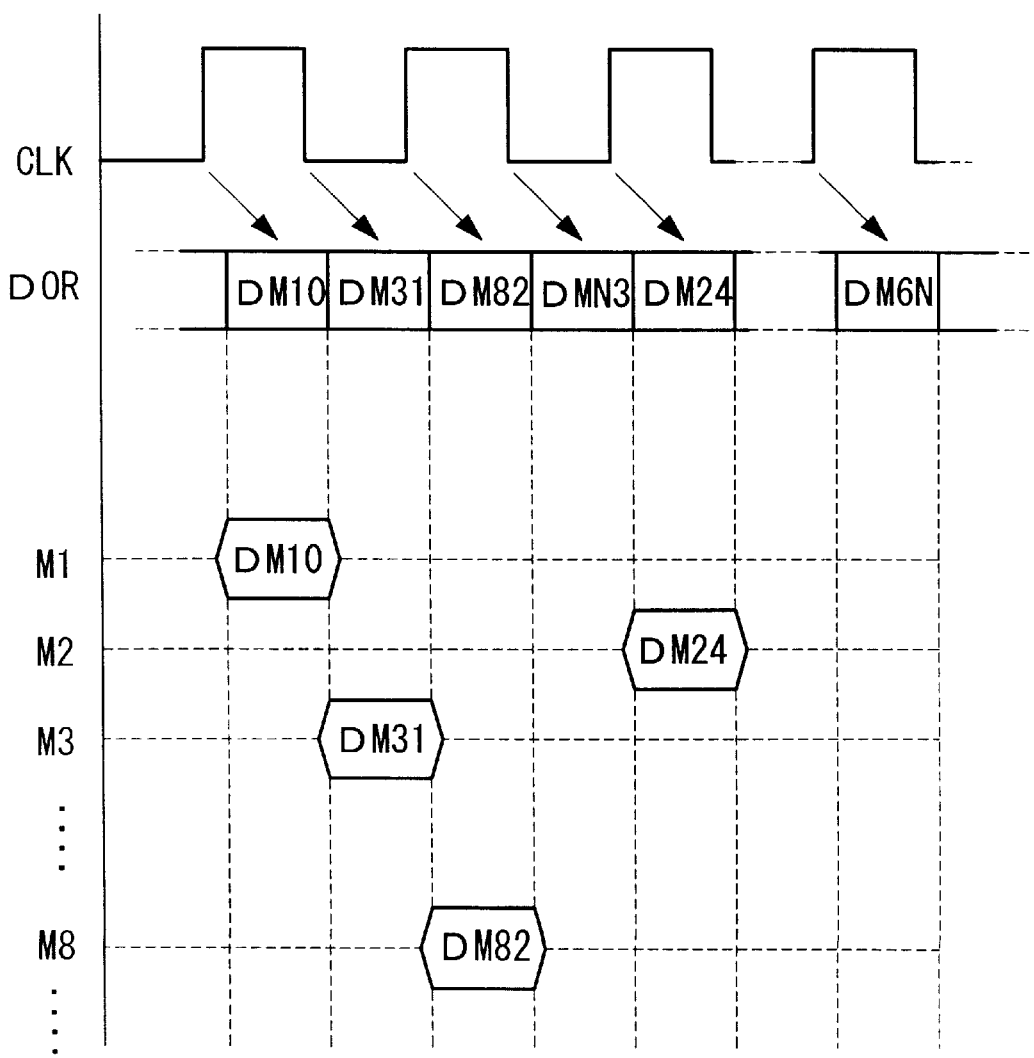
FIG. 11 is a timing chart showing an example of wired-or output DOR from an arrangement shown in FIG. 10.

More specifically, when the system reference clock is operating at several tens of megahertz, it is possible to control output bit-data according to above control signal OE (the floating control method can be utilized.). However, when the system reference clock is operating at several hundreds of megahertz (for example, 450 MHz at double data rate, DDR, and 900 MHz at single data rate, SDR), it becomes impossible to provide floating control synchronized precisely to the system reference clock. In the example shown in FIG. 11, if it is desired to output bit-1 from device M3 (data DM31), problems such as outputting of a part of the preceding group of bits, bit-0 (data DM30), or a part of the succeeding group of bits, bit-2 (data DM32), may be experienced. There is a serious concern that such results would cause the external devices such as a CPU to read incorrect data and may cause malfunction in the associated instruments.

For this reason, in the following embodiments, read data are processed before they are converted into highspeed serial data whose output cycle is several hundreds of megahertz so as to enable to output any specific bit-data within a given burst string. In other words, when the memory device is designed so that only the selected bits are output and the output of other bits are forced into the Hi-Z state, the selected bits of the read data are output by processing in the normal manner, while the remaining bits are processed to become the signal logical level which provides the Hi-Z state as the external output in the processing path of the read data, before they arrive at the multiplexer.

2. Structure of the Memory Device

Figure 2:
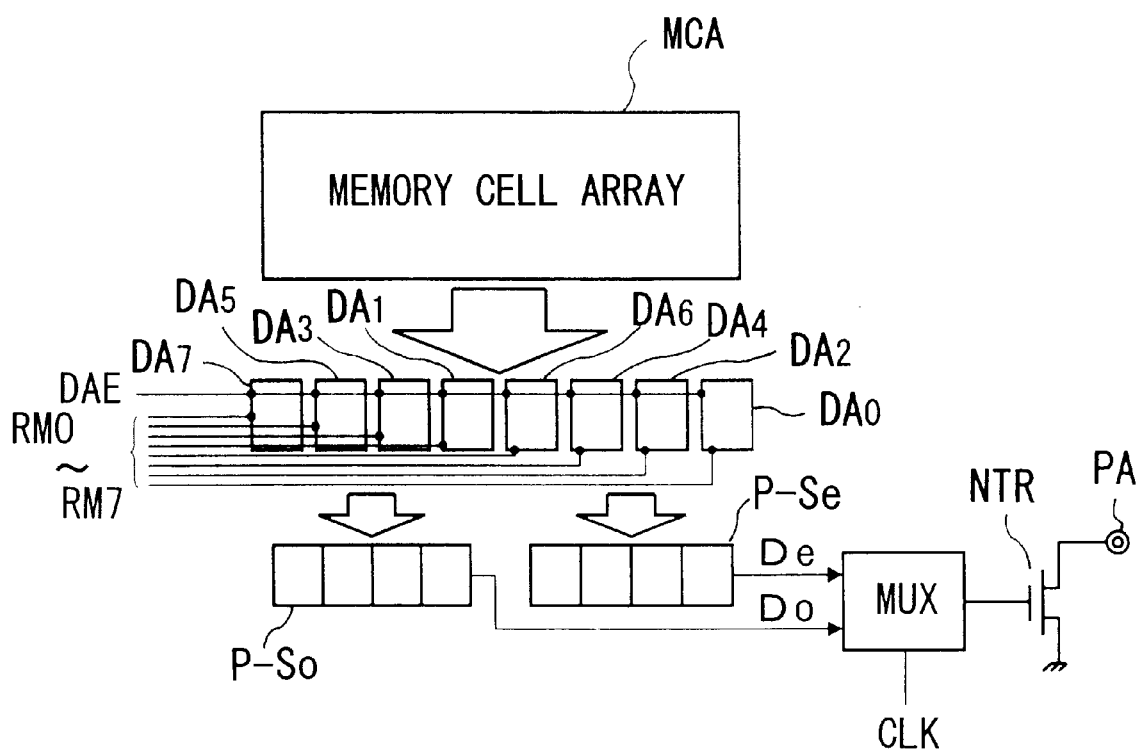
FIG. 2 is a schematic diagram of an example of the semiconductor memory device according to the present invention.

FIG. 2 shows a structure of the semiconductor memory device designed on the basis of the basic concept outlined above. The memory cell array MCA is comprised by a large number of memory cells arranged in an array, where each bit-data of even data and odd data is stored in a predetermined cell location in the array.

Here, in the present memory device, the burst length (the number of bit-data to be processed in one read/write step) is predetermined. In practice, this number is determined according to individual requirements of a system to be adopted, however, in the following presentation, it is assumed that the burst length is 8 bits. In such a case, during the write process, 8 bits write data are supplied in parallel to the memory cell array MCA through data-amps and the like (not shown), and those parallel data are input into the respective memory cells to correspond with the write address specified externally. During the read process, 8 bits read data are read out in one read step from the respective memory cells corresponding to the read address specified externally, and the read data are output in parallel to data-amps DA0 to DA7.

Data-amps DA0 to DA7 are data-amps provided for each of the bits output in one read step, and are controlled by the data-amp-enable signal DAE and read-masking signals RM0 to RM7, whose suffixes correspond to identifiers of the data-amps to receive the masking signals. Data-amp-enable signal DAE activates each of the data-amps required to amplify the read bit-data so that, if only the signal DAE is supplied without the read-masking signals RM0 to RM7, then each data-amp amplifies one bit of the 8-bit parallel data assigned thereto, and supplies this 1-bit data to parallel-serial conversion circuit P-Se or P-So.

Specifically, those bit-data of the 8 bits from the memory cell array MCA are designated as bit-0 to bit-7 in the order of outputting externally, then bit-0, bit-2, bit-4, bit-6 are designated as even data, and bit-1, bit-3, bit-5, bit-7 are designated as odd data. The data-amps DA0, DA2, DA4, DA6 receive respective even data bit-0, bit-2, bit-4, bit-6 and amplify the received bit-data to the respective logicals level to be output to the parallel-serial conversion circuit P-Se. The data-amps DA1, DA3, DA5, DA7 receive respective odd data bit-1, bit-3, bit-5, bit-7 and amplify the received data to the respective logical levels to be output to the parallel-serial conversion circuit P-So.

On the other hand, when a read-masking signal is supplied for the read operation, the data-amp receiving the read-masking signal outputs the L-level signal to the parallel-serial conversion circuit regardless of any read data from the memory cell array MCA. By this action, the bit-data of the read data passing through this data-amp is forced to be supplied at the L-level to all the subsequent components in the present memory device. For example, suppose that the read-masking signal RM0 is not provided to the data-amp DA0, but the read-masking signals RM1 to RM7, to force data-amps DA1 to DA7 to output L-level signals, are provided to each of the data-amps DA1 to DA7, only bit-0 of the read-data is output from the data-amp DA0 to be processed normally, and the remaining output signals of bits, bit-1 to bit-7, from the data-amps DA1 to DA7 are all forced to the L-level so that the read data consisting of bit-1 to bit-7 are processed henceforth as L-level data.

Read-masking signals RM0 to RM7 are pre-assigned according to which of the cells are to be given the signal, by command signal from a control device within the system such as a CPU (not shown) before the read data are accessed from the memory cells. The command signal is given in the form of read-masking signals to those data-amps, that are not to export data, to output L-level so that read-masking signal is not given to the data-amp which exports data (in other words, read-masking signal to let the data-amp operate in the normal manner and output the amplified bit-data is given.).

The parallel-serial conversion circuit P-Se receives even data amplified by the data-amps DA0, DA2, DA4, DA6, and outputs the amplified data successively synchronized to the fall of the internal reference clock, and supplies 4-bit serial even data De to the multiplexer MUX. On the other hand, the parallel-serial conversion circuit P-So receives odd data amplified by the data-amps DA1, DA3, DA5, DA7, and outputs the amplified data successively synchronized to the rise of the internal reference clock, and supplies 4-bit serial odd data Do to the multiplexer MUX.

Here, because there is no restriction on which phase of the internal reference clock, rise or fall phase, to use to process even data and odd data, the internal data processing timing may be inverted with respect to the external data processing timing. For this reason, internal clock timing is determined appropriately from design considerations and the like. Therefore, in the present memory device, when the data are exported to an external environment, even data are processed on the rise phases of the system reference clock and odd data are processed on the fall phases of the system reference clock. On the other hand, for internal processing, even data are processed on the fall phases of the internal reference clock and odd data are processed on the rise phases of the internal reference clock.

The multiplexer MUX alternately selects serial even data De and serial odd data Do supplied successively on rise and fall phases of the internal reference clock. In addition, the multiplexer MUX exports the data on the external system reference clock so that selected even data and odd data are definitely present at its output-side at the rise phases and fall phases of the external system reference clock, respectively. The NMOS transistor NTR comprises the open-drain output circuit, whose gate electrode is connected to the output-side of the multiplexer MUX, the drain electrode to the output pad PA, and the source electrode to the reference electrode at the ground potential. The output pad PA is a terminal for exporting data from the memory device to an external environment.

The circuit structure following the parallel-serial conversion circuits P-Se, P-So is the same as that shown in FIG. 1 except for the output control signals OE. Therefore, in the present memory device, the part for high speed output of serial data (that is, parallel-serial conversion circuits P-Se, P-So; multiplexer MUX; NMOS transistor NTR; and output pad PA) can be constructed using normal components of a semiconductor memory device that do not have capability for outputting any desired bit of read data.

3. Operation of the Memory Device

Next, the operation of the present memory device will be explained. For the data read operation, the controller (not shown) outputs data-amp-enable signal DAE, and supplies read-masking signals to those data-amps that amplify the bit-data not to be output to the external environment.

Suppose that only the read data of bit-2 of the 8-bit string (a third bit-data to be output) is to be exported. In this case, read-masking signals RM0, RM1 and RM3 to RM7 are supplied, and then the Read process of reading data from the memory cell array MCA is started.

The data-amp DA2 amplifies the read data of bit-2 output from the memory cell array MCA in the normal manner, and the amplified data is supplied to the parallel-serial conversion circuit P-Se. In contrast, although the data-amps DA0, DA1, DA3 to DA7 are supplied with the read data of bit-0, bit-1, bit-3 to bit-7 from the memory cell array MCA, their output signal levels are fixed at the L-level by the read-masking signals. Therefore, the read data of bit-0, bit-1, bit-3 to bit-7 are all output to the parallel-serial conversion circuit P-Se or P-So as the L-level signal data.

Accordingly, parallel-serial conversion circuit P-Se receives output data from the data-amps, and then outputs serial even data De comprised by a bit-signal at an L-level on the first fall phase of the internal reference clock, followed by the second fall phase to output a bit-signal at a level determined by the read data of bit-2, followed by the third and fourth fall phases to output bit-signals at an L-level. On the other hand, the parallel-serial conversion circuit P-So outputs serial odd data Do all at the L-level on the first to fourth rise phases of the internal reference clock.

The serial even data and serial odd data thus output from the memory cell arrays MCA are alternately selected by the multiplexer MUX according to the rise and fall of the internal system reference clock and are output to the NMOS transistor NTR. Accordingly, a signal level corresponding to bit-2 of the read data is impressed on the gate electrode of the transistor NTR only at the second rise phase of the external system reference clock, and L-level signals are impressed at the other three rise phases and four fall phases.

The result is that, after the read process is started, even though the external system reference clock rises and falls (first clock pulse is output), the output level of the output pad PA is kept at Hi-Z state to the external environment, which recognizes it as no data export. And then, at the second rise of the external system reference clock, because of the above-mentioned level of the impressed voltage on the gate electrode of the transistor NTR, bit-2 of the read data is output from the output pad PA. This state is continued until the L-level is again impressed on the gate electrode at the following second fall of the internal reference clock so that the output level is returned to the Hi-Z state. Subsequently, the Hi-Z state is maintained through the third rise, third fall, fourth rise, and fourth fall so that the output pad PA continues in the state of no data export virtually.

Accordingly, only the desired read data of bit-2 is output to the external environment at the correct timing (during the interval between the second rise and second fall of the internal reference clock, which includes the second rise-edge of the external system reference clock). At other times, the state of the output pad PA is maintained in the Hi-Z state.

Accordingly, the present memory device enables the selection and export from the memory device only the desired bit-data of any data output cycles within its burst length by selecting and supplying the read-masking signals RM0 to RM7 appropriately. The read-masking signals RM0 to RM7 fix the outputs of the data-amps at a default value by controlling the operation of the data-amps in advance, so that such internal control actions can be performed more slowly than in the method that requires the highspeed serial data to be controlled immediately before the external output. Therefore, selection and output of any desired bit according to the present method can be realized quite easily (for example, external output can be handled even at a system speed of several hundred MHz).

Also, in the present memory device, the respective data-amps are operated by receiving the data-enable signals and read-masking signals, and are comprised by amplifying means and output controlling means to determine the logical output level according to the two functions provided therein: first, to amplify the signals corresponding with the contents of the read data from the memory cells to logical levels; and second, to fix the output signal levels of the unwanted bits at the L-level. Accordingly, a plurality of bit-data are read out of the memory cell array in one read step, and all those bit-data, except those to be exported, are fixed at the L-level (which does not change the output state for the external environment) before the bit-data are converted into high-speed serial data. Therefore, circuit design for the components subsequent to the conversion to serial data can be kept the same as in the normal semiconductor memory device (there is no need for additional components), so that the present memory device design can be incorporated quite readily in the existing designs and can be realized without many modifications.

On the other hand, if the read data are to be normally output, read-masking signals RM0 to RM7 are not supplied to the data-amps DA0 to DA7, so that the bit-data from the memory cell array MCA are amplified normally, and the amplified bit-data are supplied to the parallel-serial conversion circuits P-Se, P-So. Accordingly, serial even data De and serial odd data Do, all of which consists of read data, are supplied to the multiplexer MUX, and the multiplexed data are selected alternately on the rise and fall phases of the system reference clock to supply all bit-data of the read data for the external environment from the output pad PA.

4. Specific Examples of the Memory Device Structure

Next, some specific examples of the structure of the data-amps DA0 to DA7 will be described.

EXAMPLE 1

Figure 3:
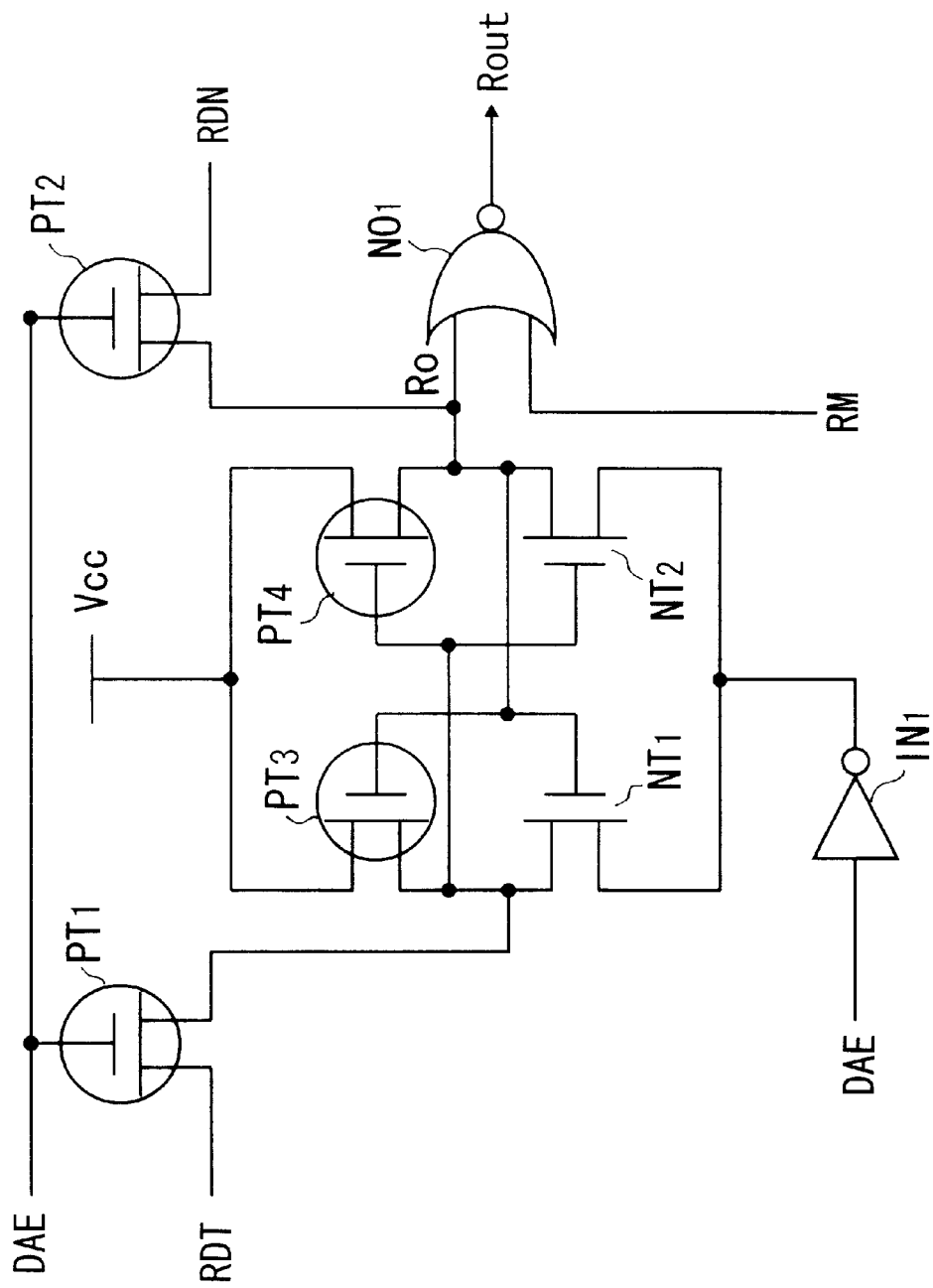
FIG. 3 is a schematic diagram of a first example of the structure of the data-amps DA0 to DA7 in the memory device shown in FIG. 2.

Example 1 of the structure of the data-amp is shown in FIG. 3. Although the structure in the diagram shows only one data-amp, the same structure is used for all data-amps DA0 to DA7 (also in all the following examples given later). Those data-amps differ from each other only in their locations and the fact that they are controlled by individual control signals.

In FIG. 3, signal line for the data-amp-enable signal DAE is connected to the gate electrodes of the PMOS transistors PT1, PT2 and to the input-side of the inverter IN 1, respectively. The PMOS transistors PT1, PT2 are input section transistors for receiving read data from the memory cell array MCA in the data-amp, and are connected to signal lines for transmitting read-data signals RDT, RDN, respectively.

Read-data signals RDT, RDN are signals output in response to the read data from the sense-amp of the memory cell array MCA, and RDT is a True-signal which assumes a value of Vcc (source voltage) when the read data is "1" and a value of "Vcc−ΔV (source voltage−microvoltage)" when the read data is "0", and RDN is the NOT-signal which is an inversion of RDT. Neglecting the details, 1-bit read data from the memory cell array MCA is transmitted by a pair of i/o lines containing two signal lines, one line of which transmits the read-data RDT while the other line transmits the read-data RDN, respectively. These signal lines are connected, respectively, to the drain electrodes of PMOS transistor PT3 and NMOS transistor NT1, and to the drain electrodes of PMOS transistor PT4 and NMOS transistor NT2, through their respective PMOS transistors PT1, PT2.

PMOS transistor PT3 and NMOS transistor NT1, on the one hand and PMOS transistor PT4 and NMOS transistor NT2 on the other, constitute CMOS inversion-amp (operating when the data-amp-enable signal DAE is at H-level), and the source electrodes of the PMOSs are connected to the power source-level electrode, and the source electrode of the NMOSs are connected to the output-side of the inverter IN1. Such an amplifying transistor circuit is referred to as an amplifying section hereinafter. Also the drain electrode of each transistor is connected to the gate electrode of the other transistor as shown in the diagram, so that the output Ro, which responds to the read-data RDT and RDN, is input into one of the input terminals of the NOR-circuit NO1. Here, output Ro refers to an output signal obtained by inverting the read data and increasing the signal level of the inverted data to a logical level, and is termed inverted amplified output Ro hereinafter.

The other input terminal of the NOR-circuit NO1 is connected to the supply line of a read-masking signal RM. A read-masking signal RM corresponds to one of the read-masking signals RM0 to RM7 so that it is at the H-level when the read data is to be fixed at the L-level, and it is at the L-level when the read data is to be transmitted normally. NOR-circuit NO1 outputs a NOT-OR signal (of the read-masking signal RM and the inverted amplified output Ro) which is supplied as amplified read-data output Rout to the parallel-serial conversion circuit P-Se or P-So.

Figure 4:
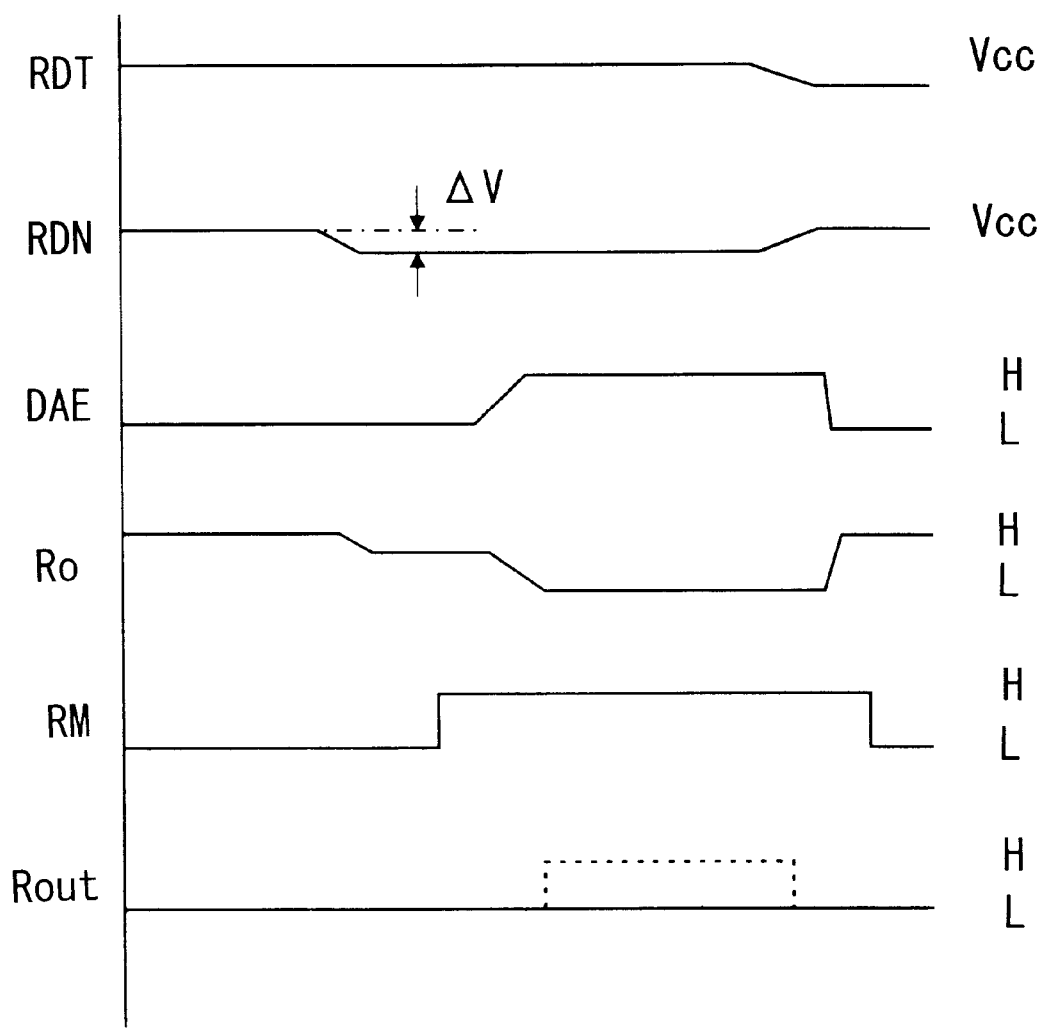
FIG. 4 is a timing chart showing the operation of the structure shown in FIG. 3.

When a read-masking signal RM at the H-level is supplied to the circuit described above, the read-data output Rout is always at the L-level regardless of the level of read data (read-data signals RDT and RDN) from the memory cell array MCA. The timing chart for this operation is shown in FIG. 4. Suppose that the read data in the memory cell array MCA is "1", the read-data signal RDT remains at the Vcc level and only the read-data signal RDN drops its voltage by ΔV, as shown in the diagram, and results in lowering the inverted amplified output Ro also as illustrated in the diagram.

After the above step, the data-amp-enable signal DAE reaches the H-level, but before this happens, the read-masking signal RM is turned to the H-level. Then, as the data-amp-enable signal DAE becomes H-level, each transistor operates and the inverted amplified output Ro reaches the L-level. Here, the read-data output Rout should normally be at the H-level, as shown by the dotted line, but because the read-masking signal RM that has been input in the other input terminal of the NOR-circuit NO1 is already at the H-level, Rout is maintained at the L-level, as shown by the solid line. Strictly speaking, however, it is acceptable to turn the read-masking signal RM to the H-level before the inverted amplified output Ro reaches the L-level.

By performing these steps, even when the read data from the memory cell array MCA is "1", an L-level signal is output to the parallel-serial conversion circuit P-Se or P-So and the external output corresponding to this read data is in the Hi-Z state. When the data-amp-enable signal DAE returns to the L-level, the read-masking signal RM also returns to the L-level, and the output operation of read-data output Rout in the data-amp is finished.

On the other hand, when the read data in the memory cell array MCA is "0", the inverted amplified output Ro and read-masking signal RM are both turned to the H-level, so that the read-data output Rout is at the L-level, and the external output is in the Hi-Z state.

As explained above, so long as the read-masking signal RM is at the H-level, the inverted amplified output Ro is blocked so that the read-data output Rout is maintained at the L-level, and the external output is in the Hi-Z state. Therefore, when using the example shown in FIG. 3, the present memory device can be operated as described by turning the read-masking signal to the H-level for not outputting the read data, and by turning the read-masking signal to the L-level for outputting the read data. It should be noted that, when the read-masking signal RM is at the L-level, read data from the memory cell array MCA is inverted and amplified and then inverted in the NOR-circuit NO1 to represent normal read data that is amplified to the logical level and is output to the parallel-serial conversion circuit P-Se or P-So.

The circuit in Example 1 is designed so that the output of the amplifying section, that amplifies read data from the memory cell array to a logical level, is blocked to be output an L-level signal when the read data is not to be output. Therefore, it is possible to fix the output logical level certainly at the L-level regardless of the output from the amplifying section.

EXAMPLE 2

Figure 5:
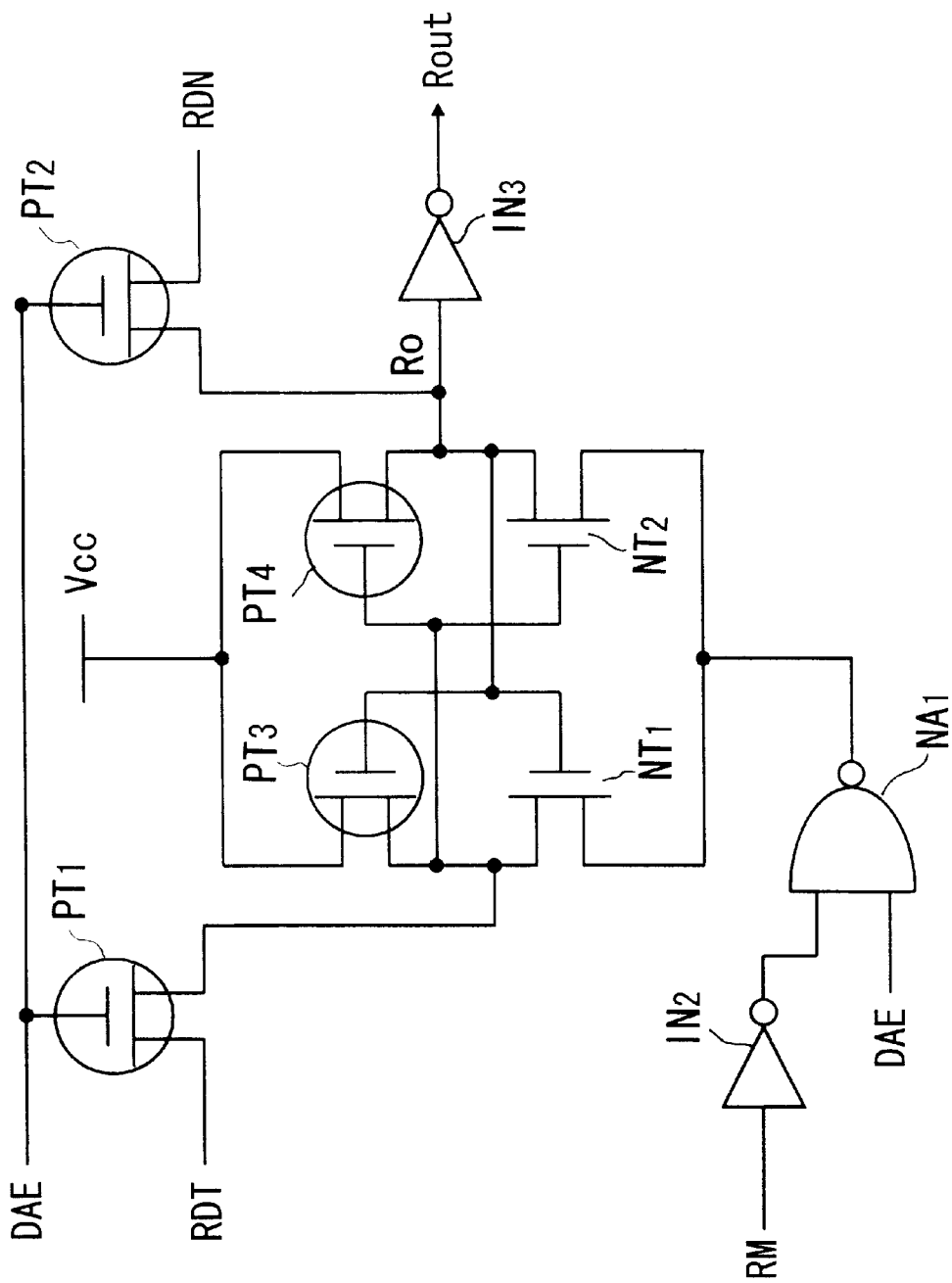
FIG. 5 is a schematic diagram of a second example of the structure of the data-amps DA0 to DA7.

A second example of the structure of the data-amps DA0 to DA7 is shown in FIG. 5. Those components that are the same as those in FIG. 3 are given the same reference numerals, and their explanations are omitted. In Example 1 shown in FIG. 3, the data-amp is operated normally, but the read-data output Rout is blocked by the read-masking signal RM so that the output to the parallel-serial conversion circuit is directly determined. However, in the present Example 2, the read-masking signal RM is used to control the supply of the data-amp-enable signal DAE so that operating or not operating the data-amp determines the read-data output Ro (fixes at the L-level), that is, to export or not to export read data.

In FIG. 5, the signal line of the data-amp-enable signal DAE is connected to the gate electrodes of the PMOS transistors PT1, PT2 and to one input terminal of the NAND-circuit NA1, and the signal line of the read-masking signal RM is connected, through the inverter IN2, to the other input terminal of the NAND-circuit NA1. The output terminal of the NAND-circuit NA1 is connected to the source electrodes of the NMOS transistors in the amplifying section. This logic circuit is designed to operate the amplifying section according to the NOT-AND signal of the data-amp-enable signal DAE and the inverted read-masking signal RM. In the initial stage, the data-amp-enable signal DAE is L-level so that the amplifying section is not operated.

The output terminal of the inverted amplified output Ro is connected to the input-side of the inverter IN3, and the output from the inverter IN3 is supplied to the parallel-serial conversion circuit P-Se or P-So as amplified read-data output Rout. Therefore, if the data-amps are operating (i.e., enabled), read data from the memory cell array MCA are amplified to the logical level and read-data output Rout are output (exported) normally.

In such a circuit, suppose that the read data in the memory cell array MCA is "1", then, the read-data signal RDT remains at the Vcc-level, as in FIG. 4, and only the read-data signal RDN drops by ΔV, and the inverted amplified output Ro drops similarly. After this stage, the read-masking signal RM is turned to the H-level before turning the data-amp-enable signal DAE to the H-level, as before, so that the output of the NAND-circuit NA1 is maintained at the H-level and the amplifying section of transistors does not operate. Therefore, inverted amplified output Ro drops only slightly to the extent corresponding to ΔV experienced by the read-data signal RDN, so that it does not drop to the L-level as in FIG. 4.

In other words, the inverted amplified output Ro only changes to the extent of change experienced by the read-data signal RDN shown in FIG. 4, and remains at the H-level as its logical level. Therefore, read-data output Rout that is an inverse of the signal Ro also remains at the L-level so that the L-level signal is output to the parallel-serial conversion circuit P-Se or P-So, and the external output becomes Hi-Z state.

On the other hand, when the read data in the memory cell array MCA is "0", the amplifying section of transistors does not operate so that the read-data output Rout is also L-level and the external output becomes Hi-Z state.

Accordingly, if the H-level signal is used for the read-masking signal, the amplifying operation of the amplifying section is stopped so that the read-data output Rout is always maintained at the L-level and the external output in the Hi-Z state. Therefore, it is possible to realize a memory device that operates similarly to the memory device using Example 1 described above. However, it is necessary to avoid the output of NAND-circuit NA1 to become L-level (inactivate the amplifying section) by avoiding the situation in which the data-amp-enable signal DAE is at the H-level and the read-masking signal RM is at the L-level. That is, before the data-amp-enable signal DAE turns to the H-level, the read-masking signal RM should be turned to the H-level and after data-amp-enable signal DAE turns to the L-level, the read-masking signal should be returned to the L-level. Consequently, this means that the timing shown in FIG. 4 should be followed for read-data signals RDT, RDN, data-amp-enable signal DAE and read-data output Rout.

In Example 2, the operation of the amplifying section is stopped so that the internal current is low and power consumption can be decreased. The advantage is that the logical level can be fixed using low power within the amplifying section, by stopping the operation of the amplifying section for read bit-data that are not to be output.

EXAMPLE 3

Figure 6:
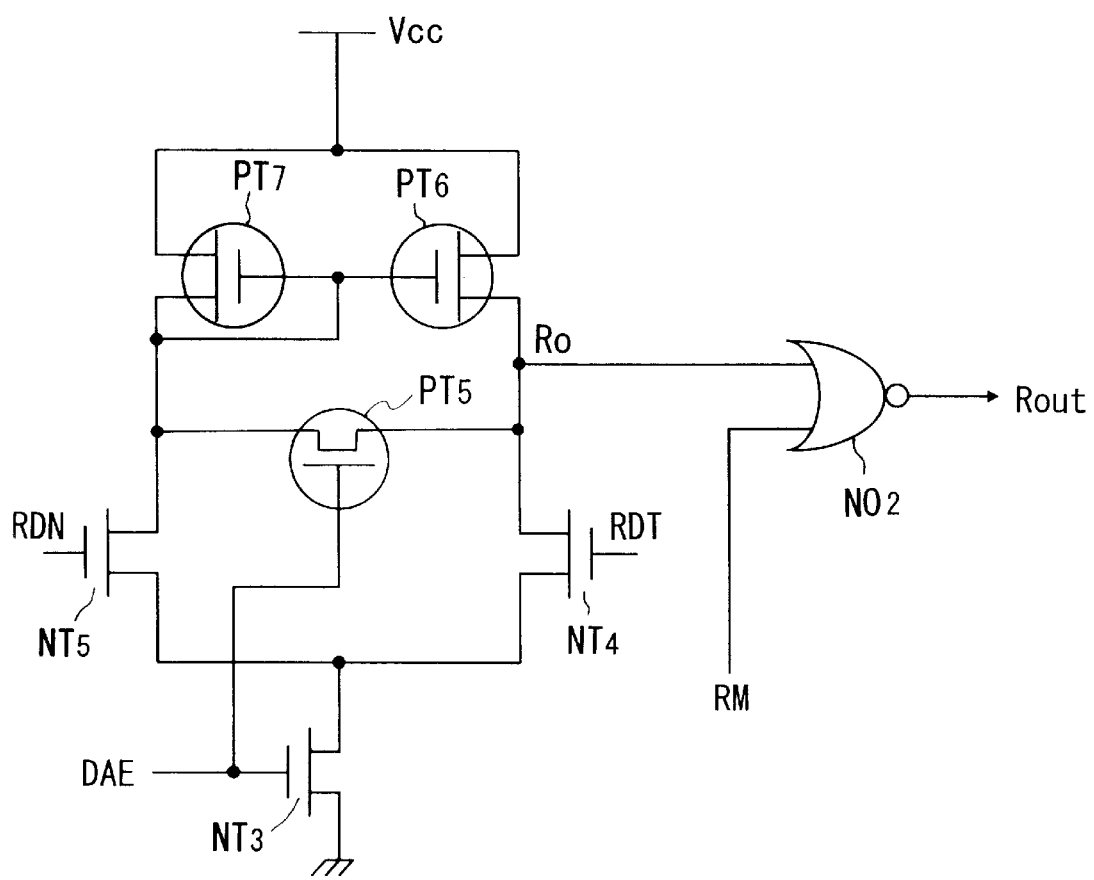
FIG. 6 is a schematic diagram of a third example of the structure of the data-amps DA0 to DA7.

A third example of the structure of the data-amps DA0 to DA7 is shown in FIG. 6. In this circuit, the signal line of the data-amp-enable signal DAE is connected to the gate electrodes of the NMOS transistor NT3 and PMOS transistor PT5. The NMOS transistor NT3 is inserted between the amplifying section (comprised by PMOS transistor PT6, NMOS transistor NT4 and PMOS transistor PT7, NMOS transistor NT5) and the ground-level electrode, as shown in FIG. 6. The PMOS transistor PT5 is inserted between the drain electrodes in the amplifying section as shown. This circuit operates such that when the data-amp-enable signal DAE is at the L-level, the left and right CMOS inversion-amps are balanced, but it operates as an amplifying section when the DAE is at the H-level.

The signal lines for read-data signals RDT, RDN are respectively connected to the gate electrodes of the NMOS transistors NT4, NT5. Also, the drain electrodes of the PMOS transistor PT7 and NMOS transistor NT5 are connected to the gate electrodes of the PMOS transistors PT6, PT7. This circuit produces inverted amplified output Ro at the drain electrodes of the PMOS transistor PT6 and NMOS transistor NT4. The drain electrodes are connected to one input terminal of the NOR-circuit NO2.

Other input terminal of the NOR-circuit NO2 is connected to the signal line of the read-masking signal RM. Also in this case, the read-masking signal RM is turned to the H-level when the read data is to be fixed at the L-level, and for normal output, it is turned to the L-level, and the NOR-circuit NO2 supplies NOT-AND signal of the read-masking signal RM and inverted amplified output Ro to the parallel-serial conversion circuit P-Se or P-So as the read-data output Rout.

In this circuit structure, the read-data output Rout is controlled directly at its output point as in Example 1. Therefore, although the internal operation is somewhat different, the timing chart is the same as that shown in FIG. 4, and the memory device can be operated by supplying the read-masking signal RM as in Example 1.

That is, suppose that the read data in the memory cell array MCA is "1", the read-data signal RDT becomes Vcc, and read-data signal RDN becomes Vcc−ΔV, when the data-amp-enable signal DAE turns to the H-level, the inverted amplified output Ro becomes L-level. Therefore, before this event, the read-masking signal RM is turned to the H-level, and the output from the NOR-circuit NO2 which should change to the H-level is forced to the L-level, thereby turning the read-data output Rout to the L-level and maintaining the external output at the Hi-Z state. The same steps are taken when the read data is "0" to supply the read-masking signal RM and maintain the external output at Hi-Z state.

EXAMPLE 4

Figure 7:
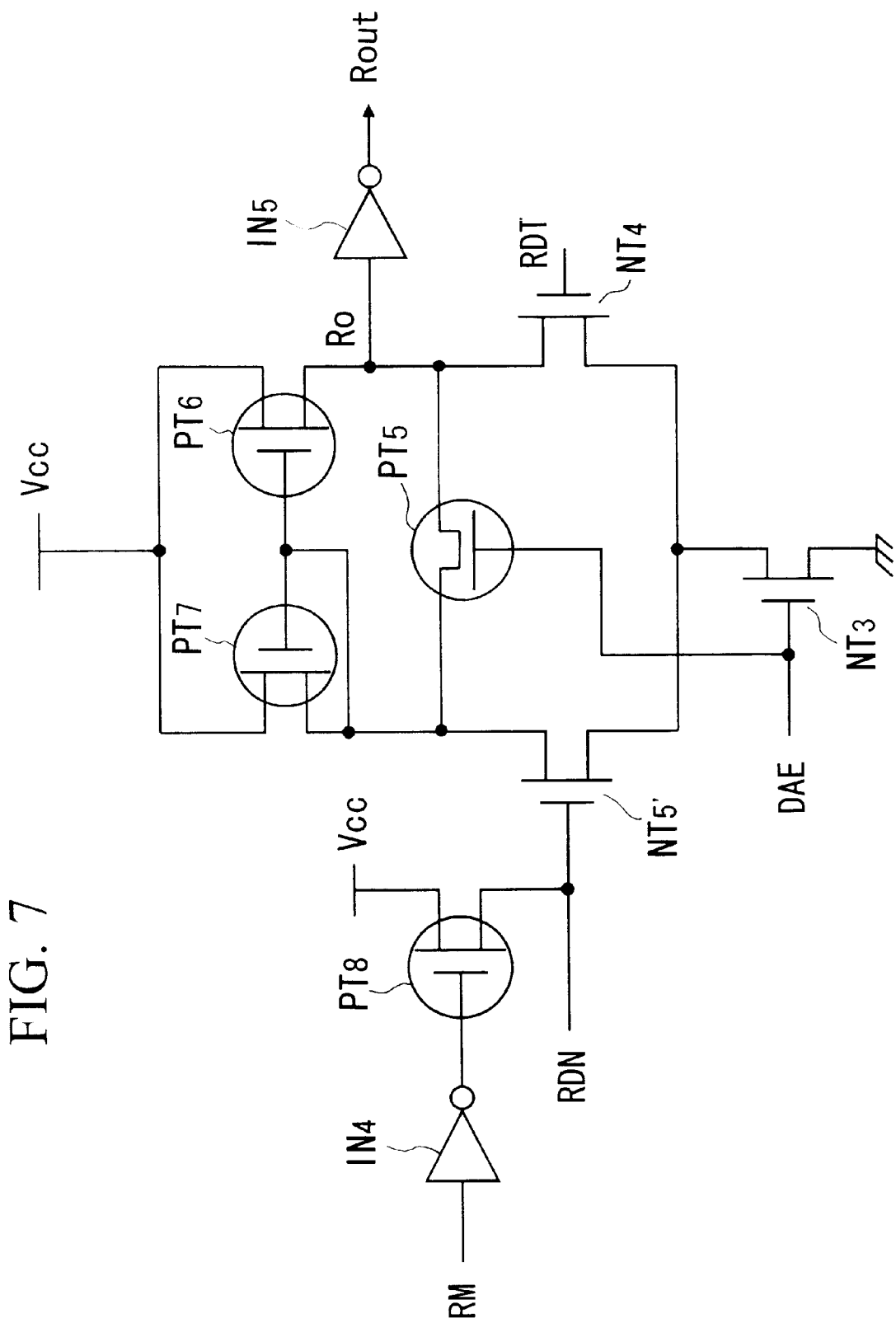
FIG. 7 is a schematic diagram of a fourth example of the structure of the data-amps DA0 to DA7.

A fourth example of the structure of data-amps DA0 to DA7 is shown in FIG. 7. In this diagram, those components that are the same as those in FIG. 6 are given the same reference numerals, and their explanations are omitted. In this circuit, read-data output Rout is fixed at the L-level by forcing the read-data signals RDT, RDN from the memory cell array MCA to be signals corresponding to the L-level signals.

In FIG. 7, NMOS transistor NT5' constitutes a part of the amplifying section, which is similar to the NMOS transistor NT5, whose gate electrode is connected to the signal line of the read-data signal RDN and to the drain electrode of the PMOS transistor PT8. The gate electrode of the PMOS transistor PT8 is connected to the signal line of the read-masking signal RM through the inverter IN4, and the source electrode is connected to the power source-level electrode. The input-side of the inverter IN5 is connected to the drain electrode for obtaining inverted amplified output Ro, and the output-side of the inverter IN5 is connected to the parallel-serial conversion circuit P-Se or P-So to output read-data output Rout.

Figure 8:
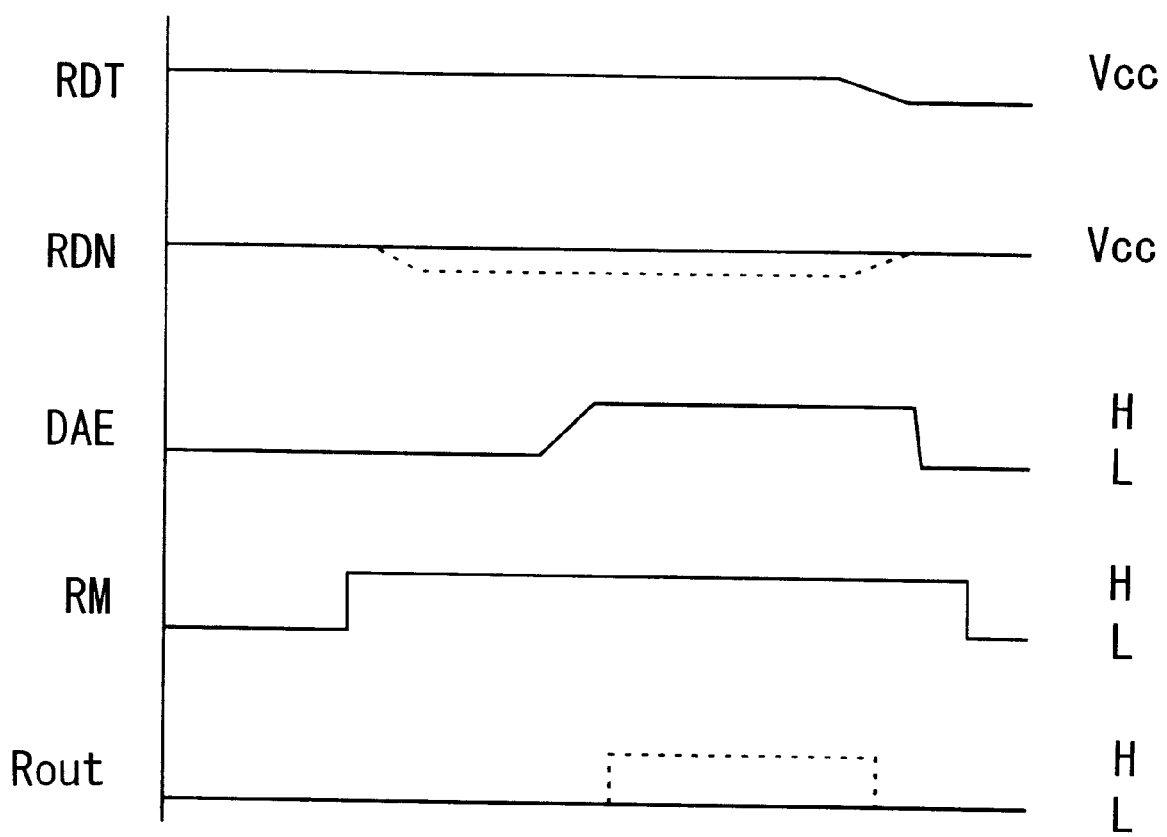
FIG. 8 is a timing chart showing the operation of the structure shown in FIG. 7.

In the memory device described above, external output is not at the Hi-Z state only when the read data is "1"(H-level), and at that time, the read-data signal RDT is at Vcc and RDN is at Vcc−(x)V. For this reason, this circuit is designed so that the external output is maintained at the Hi-Z state by supplying the read-masking signal RM in such a way that the read-data signal RDN is always at the Vcc level during the read operation. The timing chart for this operation is shown in FIG. 8.

Suppose that the read data in the memory cell array MCA is "1", then the read-data signal RDN should drop by ΔV as shown by the dotted line. However, before the signal drops, the read-masking signal is turned to the H-level to turn on the PMOS transistor PT8. By so doing, the signal level of the read-data signal RDN at the gate electrode of the NMOS transistor NT5' is forced to be maintained at Vcc level.

This state is the same as the state of no supply of read data. Therefore, even if the data-amp-enable signal DAE is turned to H-level after this stage, the read-data output Rout is maintained at the L-level as shown by the solid line (i.e., the signal level does not increase to the dotted line level for normal operation). Therefore, even if the read data from the memory cell array MCA is "1", an L-level signal is output to the parallel-serial conversion circuit P-Se or P-So, and the external output is maintained at the Hi-Z state. Here, after the data-amp-enable signal DAE is returned to the L-level, or after the read-data RDN is returned to Vcc level, the read-masking signal RM is also returned to L-level to finish the output operation of the read-data output Rout in the data-amp.

According to such a circuit structure, the memory device maintains the external output at the Hi-Z state by supplying the read-masking signal RM at the H-level. In other words, the logical output level of read data is already determined at the fore-stage of the amplifying section by providing the amplifying section with a signal corresponding to the L-level output as the signal to indicate the content of the read bit-data not to be output externally. However, because the amplifying section is not operative unless the data-amp-enable signal DAE is supplied, instead of turning the read-masking signal RM to H-level before supplying read-data signal RDN, the read-masking signal RM may be turned to H-level before the data-amp-enable signal DAE is turned to the H-level as in the foregoing examples.

As explained above, the present semiconductor memory device has been demonstrated by examples, but the circuit designs are not limited only to those embodied specifically in various examples, and includes those modifications within the scope of the basic principle presented that exporting of bit-data from the memory device to an external environment for read operation can be controlled within the memory device by processing the output bit-data before they reach the output means of the memory device, in other words, before the data are converted into highspeed serial data within the memory device.

What is claimed is:

1. A semiconductor memory device for reading data of a plurality of bits from its memory cell region simultaneously and outputting said data to an external environment successively, including:

external output means whose output state to the external environment is altered for one output logical level and not altered for another output logical level;

output level generation means for assigning a logical level corresponding to the content of bit-data to a bit freely selected out of said data, and assigning said another output logical level to another bit; and supply means for successively supplying the output logical levels, generated by said output level generation means to correspond with respective bits of said data, to said external output means.

2. A semiconductor memory device according to claim 1, wherein said output level generation means comprise:

amplifying circuit means for amplifying signals output from said memory cell region, that correspond with respective contents of bit-data, to logical levels; and output control circuit means for fixing the logical level output for said another bit by said amplifying circuit means at said another output logical level.

3. A semiconductor memory device according to claim 2, wherein said output control circuit means blocks the output of said amplifying circuit means to output said another output logical level for said another bit.

4. A semiconductor memory device according to claim 2, wherein said output control circuit means stops amplifying operations of said amplifying circuit means for said another bit.

5. A semiconductor memory device according to claim 2, wherein said output control circuit means provide said amplifying circuit means with the signal corresponding to said another output logical level as an output signal of said another bit from said memory cell region.

6. A semiconductor memory device according to claim 1, wherein:

said external output means comprises an open drain circuit of an NMOS (n-channel metal oxide semiconductor) transistor;

said output level generation means assigns low level to said another bit as said another output logical level; and said supply means successively applies the output logical levels, generated by said output level generation means to correspond with respective bits of said data, to a gate electrode of the NMOS transistor.

7. A semiconductor memory device according to claim 2, wherein:

said external output means comprises an open drain circuit of an NMOS transistor;

said output control circuit means fixes the logical level output for said another bit by said amplifying circuit means at low level so that an output logical level of said another bit becomes low level; and said supply means successively applies the output logical levels, generated by said output level generation means to correspond with respective bits of said data, to a gate electrode of the NMOS transistor.

8. A semiconductor memory device according to claim 3, wherein:

said external output means comprises an open drain circuit of an NMOS transistor;

said output control circuit means blocks the output of said amplifying circuit means to output a low level signal as said another output logical level so that the output logical level of said another bit to become low level; and said supply means successively applies the output logical levels, generated by said output level generation means to correspond with respective bits of said data, to a gate electrode of the NMOS transistor.

9. A semiconductor memory device according to claim 4, wherein:

said external output means comprises an open drain circuit of an NMOS transistor;

said output control circuit means stops amplifying operations of said amplifying circuit means for said another bit so that the output logical level of said another bit to become low level; and said supply means successively applies the output logical levels, generated by said output level generation means to correspond with respective bits of said data, to a gate electrode of the NMOS transistor.

10. A semiconductor memory device according to claim 5, wherein:

said external output means comprises an open drain circuit of an NMOS transistor;

said output control circuit means provides said amplifying circuit means with a signal corresponding to low level as an output signal of said another bit from said memory cell region so that the output logical level of said another bit to become low level; and said supply means successively applies the output logical levels, generated by said output level generation means to correspond with respective bits of said data, to a gate electrode of the NMOS transistor.

11. A semiconductor memory device according to claim 6, wherein said supply means impresses the output logical levels at a high speed of several hundred megahertz.

12. A semiconductor memory device according to claim 7, wherein said supply means impresses the output logical levels at a high speed of several hundred megahertz.

13. A semiconductor memory device according to claim 8, wherein said supply means impresses the output logical levels at a high speed of several hundred megahertz.

14. A semiconductor memory device according to claim 9, wherein said supply means impresses the output logical levels at a high speed of several hundred megahertz.

15. A semiconductor memory device according to claim 10, wherein said supply means impresses the output logical levels at a high speed of several hundred megahertz.

* * * * *